United States Patent
Li

(10) Patent No.: US 7,346,117 B2
(45) Date of Patent: Mar. 18, 2008

(54) TURBO DECODER

(75) Inventor: Jifeng Li, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 456 days.

(21) Appl. No.: 11/087,372

(22) Filed: Mar. 23, 2005

(65) Prior Publication Data

US 2005/0185740 A1 Aug. 25, 2005

Related U.S. Application Data

(63) Continuation of application No. PCT/JP03/04115, filed on Mar. 31, 2003.

(51) Int. Cl.
*H04L 27/06* (2006.01)
(52) U.S. Cl. .................. 375/262; 375/341; 375/262; 741/786; 741/758; 741/752; 741/792; 741/796
(58) Field of Classification Search ............ 375/341, 375/262; 741/786, 758, 752, 792, 796, 780, 741/755

See application file for complete search history.

(56) References Cited

U.S. PATENT DOCUMENTS

| 2001/0025358 A1* | 9/2001 | Eidson et al. ............ 714/752 |
| 2002/0166095 A1* | 11/2002 | Lavi et al. .............. 714/786 |
| 2003/0028838 A1 | 2/2003 | Chang et al. |
| 2003/0106012 A1* | 6/2003 | Hewitt ................... 714/780 |

FOREIGN PATENT DOCUMENTS

| JP | 2000-201085 | 7/2000 |
| JP | 2001-230677 | 8/2001 |
| JP | 2001-358699 | 12/2001 |

OTHER PUBLICATIONS

Supplementary European Search Report dated Mar. 27, 2007.
Lei Cao, et al. "Novel Product Coding and Decoding Scheme for Wireless Image Transmission" Proc. 2000 International Conference on Image Processing ICIP 2000, vol. 2 of 3, conf. 7, Sep. 10, 2000, pp. 144-147, XP002285555.
Jifeng Li, et al. "Turbo Coding for W-CDMA System" Proceedings of the European Wireless, No. 157, Oct. 6, 1999, pp. 397-401, XP008004612.
International Search Report dated Jul. 1, 2003.
A. Shibutani, et al. Reducing Average Number of Turbo Decoding Iterations. Electronics Letters, Apr. 1999, vol. 35, No. 9, pp. 701-702.

* cited by examiner

*Primary Examiner*—Chieh M. Fan
*Assistant Examiner*—Siu M Lee
(74) *Attorney, Agent, or Firm*—Katten Muchin Rosenman LLP

(57) ABSTRACT

A turbo decoder is disclosed that receives a demodulated input signal before a hard decision, including blocks each of multiple data units, and outputs a decoded signal block by block. The turbo decoder includes a decoding part outputting a decoded output signal and extrinsic likelihood information based on the input signal and preliminary likelihood information, the extrinsic likelihood information being used as the preliminary likelihood information in creating the next output signal; a specification part specifying a data unit of the block with respect to which no error is detected in error checking performed on each data unit of the hard decision output signal; and a replacement part inputting a signal sequence, created by replacing signal data before the hard decision with those after the hard decision with respect to the data unit specified by the specification part, to the decoding part as the input signal.

16 Claims, 5 Drawing Sheets

TURBO DECODER

CROSS-REFERENCE TO RELATED APPLICATION

This application is a U.S. continuation application filed under 35 U.S.C. 111(a) claiming benefit under 35 U.S.C. 120 and 365(c) of PCT International Application No. PCT/JP2003/004115, filed on Mar. 31, 2003, the entire contents of which are hereby incorporated by reference.

BACKGROUND OF THE INVENTION

1. Field of the Invention

The present invention relates to decoders in the case of demodulating a received signal in mobile communications, and particularly to a turbo decoder.

2. Description of the Related Art

In mobile communications, it is necessary to prevent incorrect reception of the contents of transmission due to phasing, multipath, and noise during signal transmission. Accordingly, a transmission signal is often encoded at a transmission end and subjected to error detection and correction at a reception end.

For instance, information such as an IP (Internet Protocol) packet is transmitted as follows. An IP packet that can be relatively large in size is divided into packet data units (PDU) of a predetermined small size at the transmission end. A cyclic redundancy check (CRC) code is added to each packet data unit. A predetermined number of packet data units to each of which the CRC code is added are reconnected to form the signal contents of a single block. Turbo coding for increasing error correction capability is performed on each of these blocks. The blocks are transmitted after being further subjected to puncturing for increasing transmission rate. A signal is divided into packet data units relatively small in size mainly in order to eliminate the necessity of a large-capacity memory and a processor of high computing power at the reception end. Further, multiple packet data units are joined to form a block because a long data sequence is preferable in terms of improving encoding quality such as block error rate.

At the reception end, de-puncturing is performed on a received signal so that a predetermined data bit is inserted into the position of a bit removed at the time of puncturing. Turbo decoding is performed on this signal block by block so that the correctness of the entire block is checked using the CRC code added to each packet data unit. If there is no error, the individual packet data units are joined to each other so that the transmitted desired data is restored. If an error is detected, decoding calculations are reperformed, or retransmission from the transmission end is requested.

In general, a turbo decoder employed in such decoding includes multiple (for instance, two) decoders and an error detector connected to the output of the rearmost decoder. One of the decoders performs decoding calculations with a signal from another one of the decoders, and provides its output to the other one of the decoders. By exchanging likelihood information on the likelihood of the signal contents between the decoders, decoding is performed repetitively. Likelihood information input to a decoder is referred to as preliminary likelihood information, and likelihood information output from the decoder is referred to as extrinsic likelihood information. However, there is no strict distinction between the preliminary likelihood information and the extrinsic likelihood information (for instance, extrinsic likelihood information from a first decoder may be used as preliminary likelihood information for the next second decoder). A turbo decoding method is disclosed in, for instance, Japanese Laid-Open Patent Application No. 2000-201085 (Patent Document 1). A turbo decoder itself is disclosed in, for instance, Japanese Laid-Open Patent Application No. 2001-230677 (Patent Document 2).

FIGS. 1 and 2 are block diagrams for illustrating a conventional method of turbo encoding and decoding. FIG. 1 is a block diagram of signal processing related to turbo encoding performed at a transmission end. In general, a signal sequence X to be transmitted is transmitted as signal sequences of three forms. A first signal sequence xa is transmitted in the exact form of the input signal sequence. A second signal sequence xb is created by subjecting the input signal sequence to convolutional encoding in a convolutional encoder 102. A third signal sequence xc is created by subjecting the input signal to convolutional encoding in a convolutional encoder 106 after changing data order in the signal sequence in an interleaver 104. These signal sequences of three lines are transmitted to a reception end after being subjected to modulation.

FIG. 2 is a block diagram of signal processing related to turbo decoding performed at the reception end. The received signals are demodulated, and three signal sequences ya, yb, and yc corresponding to the signal sequences of three lines xa, xb, and xc created at the transmission end are obtained. These signals are signals after a soft decision, that is, signals before a hard decision related to binary signal determination such as "0" or "1" is made. In general, a signal after a soft decision (soft decision data) is expressed in multi-bit floating-point notation.

A turbo decoder includes a first decoding part 202, to which the first and second input signal sequences ya and yb and preliminary likelihood information Le2' are input. Based on these input signals, the first decoding part 202 outputs a first output signal L1 and extrinsic likelihood information Le1, which are decoding results.

The first input signal sequence ya is interleaved by an interleaver 204 to be input to a second decoding part 208. The first extrinsic likelihood information Le1 from the first decoding part 202 is also interleaved by an interleaver 206 to be input to the second decoding part 208. The third input signal sequence yc is also input to the second decoding part 208. That is, the first decoding part 202 performs decoding based on the non-interleaved signals, while the second decoding part 208 performs decoding based on the interleaved signals. In this case, Le1', which is the interleaved first extrinsic likelihood information Le1 from the first decoding part 202, is input to the second decoding part 208 as preliminary likelihood information. The second decoding part 208 outputs a second output signal L2 and extrinsic likelihood information Le2, which are decoding results.

The extrinsic likelihood information Le2 is input (fed back) to the first decoding part 202 as preliminary likelihood information after being deinterleaved by a deinterleaver 210. The second output signal L2 from the second decoding part 208 is deinterleaved by a deinterleaver 212 to be input to a hard decision part 214. The deinterleavers 210 and 212 are means for restoring the data order that has been rearranged by the interleavers 204 and 206 and the interleaver 104 (FIG. 1) at the transmission end. The hard decision part 214 makes a hard decision on soft decision data included in the decoded signal, and creates a binary-signal data sequence U(k) (k represents a sample number). The data sequence U(k) after the hard decision is input to an error check part 216. The error check part 216 performs a cyclic redundancy check (CRC) on all packet data units (PDUs) included in the data sequence U(k) of one block after the hard decision.

The first and second decoding parts 202 and 208 output the decoded signals L1 and L2 repetitively, exchanging extrinsic likelihood information with each other. By repetitively feeding back extrinsic likelihood information to each other, error correction capability in decoding can be improved compared with a case without performing it. The decoding result thus calculated is subjected to a hard decision in the hard decision part 214 and to error checking in the error check part 216. If no error is detected with respect to any packet data unit, this shows that the block is received and decoded satisfactorily, so that the processing of a later stage not graphically illustrated is caused to proceed. If an error is detected, this shows that the reception and decoding of the block includes an error, so that, for instance, retransmission is requested from the transmission end, or the number of repetitions of decoding is increased, thereby restoring appropriate data.

SUMMARY OF THE INVENTION

However, there is concern that if the number of packet data units included in one block increases, repeating a decoding operation until no error is detected or requesting retransmission of a transmitted signal with respect to any of the packet data units may significantly prolong decoding.

Accordingly, it is a general object of the present invention to provide a turbo decoder in which the above-described disadvantage is eliminated.

Another more specific object of the present invention is to provide a turbo decoder that can decode demodulated soft decision data with more efficiency than conventionally.

The above objects of the present invention are achieved by a turbo decoder receiving a demodulated input signal before a hard decision, the input signal including blocks each being formed of a plurality of data units, the turbo decoder outputting a decoded signal block by block, the turbo decoder including: a decoding part configured to output a decoded output signal and extrinsic likelihood information relating to signal likelihood based on the input signal and preliminary likelihood information relating to signal likelihood, wherein the output signal is repetitively generated and the extrinsic likelihood information is used as the preliminary likelihood information in creating the next output signal; a specification part configured to specify one of the data units of the block with respect to which no error is detected in error checking performed on each of the data units included in the output signal subjected to the hard decision; and a replacement part configured to input a signal sequence to the decoding part as the input signal, the replacement part creating the signal sequence by replacing signal data before the hard decision with signal data after the hard decision with respect to the data unit specified by the specification part.

The above objects of the present invention are also achieved by a turbo decoder receiving a demodulated input signal before a hard decision, the input signal including blocks each being formed of a plurality of data units, the turbo decoder outputting a decoded signal block by block, the turbo decoder including: a first decoding part configured to output a decoded first output signal and first extrinsic likelihood information relating to signal likelihood based on the input signal and preliminary likelihood information relating to signal likelihood; a second decoding part configured to output a decoded second output signal and second extrinsic likelihood information relating to signal likelihood based on the input signal and the first extrinsic likelihood information from the first decoding part, wherein the second extrinsic likelihood information is used as the preliminary likelihood information; a specification part configured to specify one of the data units of the block with respect to which no error is detected in error checking performed on each of the data units included in the second output signal subjected to the hard decision; and a replacement part configured to input a signal sequence to the first decoding part as the input signal, the replacement part creating the signal sequence by replacing signal data before the hard decision with signal data after the hard decision with respect to the data unit specified by the specification part.

The above objects of the present invention are also achieved by a turbo decoder receiving a demodulated input signal before a hard decision, the input signal including blocks each being formed of a plurality of data units, the turbo decoder outputting a decoded signal block by block, the turbo decoder including: a first decoding part configured to output a decoded first output signal and first extrinsic likelihood information relating to signal likelihood based on the input signal and first preliminary likelihood information relating to signal likelihood; a second decoding part configured to output a decoded second output signal and second extrinsic likelihood information relating to signal likelihood based on the input signal and second preliminary likelihood information relating to signal likelihood, wherein the first extrinsic likelihood information from the first decoding part is used as the second preliminary likelihood information, and the second extrinsic likelihood information is used as the first preliminary likelihood information; a specification part configured to specify one of the data units of the block with respect to which no error is detected in error checking performed on each of the data units included in the second output signal subjected to the hard decision; a first replacement part configured to input a signal sequence to the first decoding part as the input signal, the first replacement part creating the signal sequence by replacing signal data before the hard decision with signal data after the hard decision with respect to the data unit specified by the specification part; and a second replacement part configured to replace the signal data before the hard decision with the signal data after the hard decision and changing the first or second preliminary likelihood information to a predetermined value with respect to the data unit specified by the specification part so that the first or second decoding part newly calculates the first or second extrinsic likelihood information.

According to one aspect of the present invention, a turbo decoder includes a decoding part that decodes a signal based on input signal sequences and preliminary likelihood information, and outputs extrinsic likelihood information, a specification part that specifies a packet data unit whose error checking result has been satisfactory, and a replacement part that replaces the signal data of the packet data unit with the signal data after a hard decision. As a result, the next decoding calculation is performed based on a signal sequence whose signal data correctness is assured. This makes it possible to improve the accuracy and convergence of decoding calculations, and accordingly, to perform decoding with efficiency.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

First Embodiment

Figure 1:
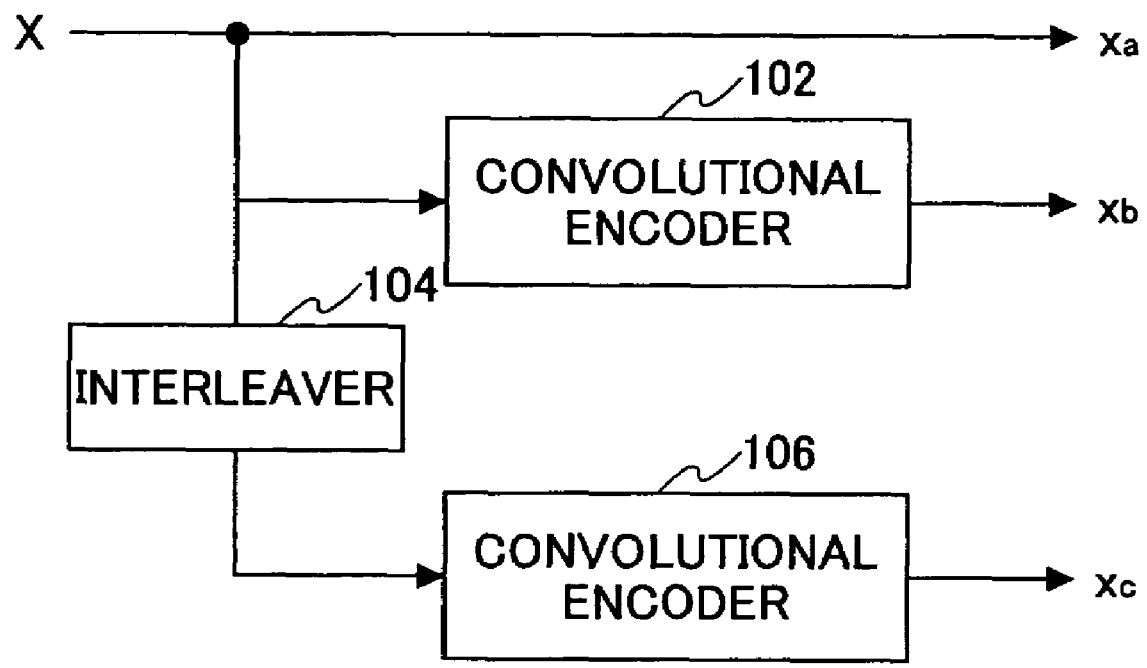
FIG. 1 is a block diagram for illustrating a conventional turbo encoding method.

A description is given below, using block diagrams for simplification, of turbo decoders according to embodiments of the present invention. It is possible to realize multiple blocks in the drawings by a single element, not to mention to realize each block as an individual element.

Figure 2:
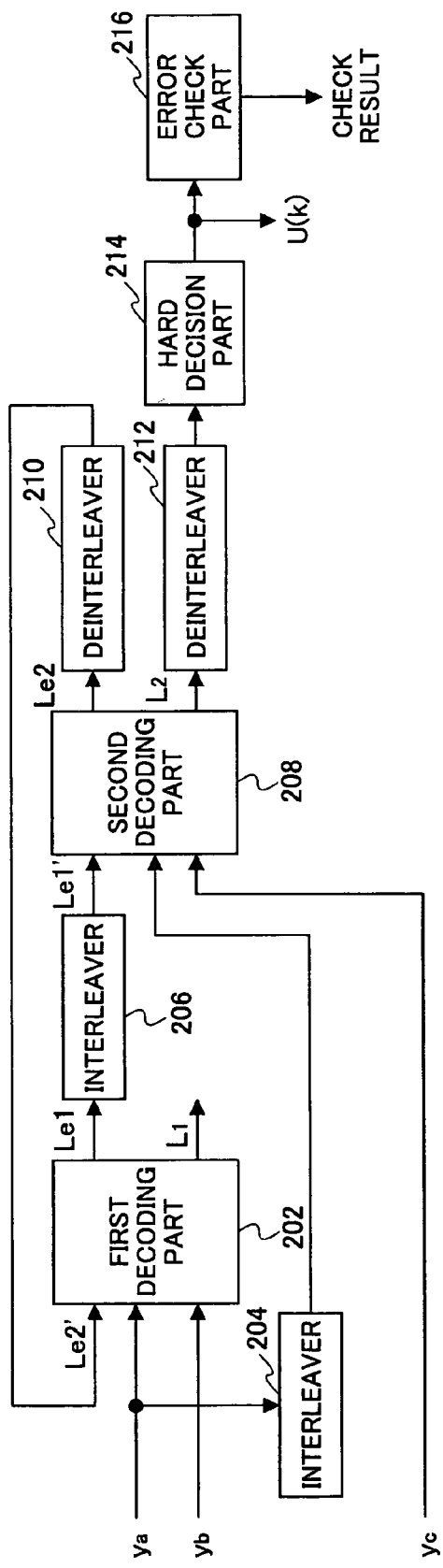
FIG. 2 is a block diagram for illustrating a conventional turbo decoding method.
Figure 3:
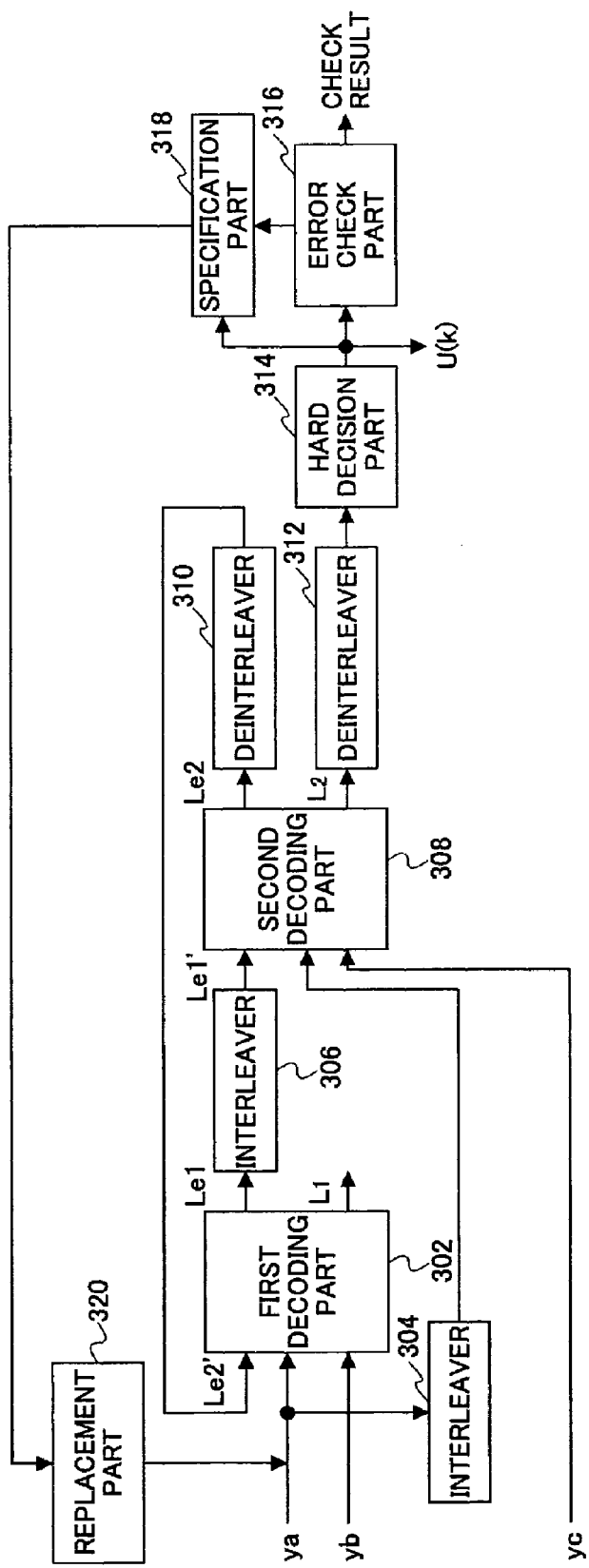
FIG. 3 is a block diagram for illustrating a turbo decoding method according to a first embodiment of the present invention.

FIG. 3 is a block diagram for illustrating a turbo decoding method according to a first embodiment of the present invention. As mentioned in reference to FIGS. 1 and 2, the signal sequence X to be transmitted is transmitted as signal sequences of three forms. The first signal sequence xa is transmitted in the exact form of the input signal sequence. The second signal sequence xb is created by subjecting the input signal sequence to convolutional encoding. The third signal sequence xc is created by subjecting the input signal to convolutional encoding after interleaving the input signal. These signal sequences of three lines are transmitted to a reception end after being subjected to modulation. The signals are received at the reception end and demodulated, so that the three signal sequences ya, yb, and yc corresponding to the signal sequences of three lines xa, xb, and xc created at the transmission end are obtained. These signals are signals after a soft decision, and in general, are expressed in multi-bit floating-point notation. These signals are finally determined as binary signals such as "1" or "0" (hard decision).

A turbo decoder according to this embodiment includes a first decoding part 302, to which the first and second input signal sequences ya and yb and preliminary likelihood information Le2' are input. Based on these input signals, the first decoding part 302 outputs a first output signal L1 and extrinsic likelihood information Le1, which are decoding results.

The first input signal sequence ya is interleaved by an interleaver 304 to be input to a second decoding part 308. The first extrinsic likelihood information Le1 from the first decoding part 302 is also interleaved by an interleaver 306 to be input to the second decoding part 308. The third input signal sequence yc is also input to the second decoding part 308. That is, the first decoding part 302 performs decoding based on the non-interleaved signals, while the second decoding part 308 performs decoding based on the interleaved signals. In this case, Le1', which is the interleaved first extrinsic likelihood information Le1 from the first decoding part 302, is input to the second decoding part 308 as preliminary likelihood information. The second decoding part 308 outputs a second output signal L2 and extrinsic likelihood information Le2, which are decoding results.

The extrinsic likelihood information Le2 is input to the first decoding part 302 as preliminary likelihood information after being deinterleaved by a deinterleaver 310. The second output signal L2 from the second decoding part 308 is deinterleaved by a deinterleaver 312 to be input to a hard decision part 314. The deinterleavers 310 and 312 are means for restoring the data order that has been rearranged by the interleavers 304 and 306 and the interleaver at the transmission end (for instance, 104 of FIG. 1). The hard decision part 314 makes a hard decision on soft decision data included in the decoded signal, and creates a binary-signal data sequence U(k) (k represents a sample number). The data sequence U(k) after the hard decision is input to an error check part 316. The error check part 316 performs a cyclic redundancy check (CRC) on all packet data units (PDUs) included in the data sequence U(k) of one block after the hard decision.

Further, the turbo decoder according to this embodiment includes a specification part 318. The specification part 318 determines a packet data unit of the block with respect to which no error has been detected in the error checking performed on each packet data unit. The turbo decoder according to this embodiment includes a replacement part 320 connected to the specification part 318. With respect to a packet data unit in the input signal sequence corresponding to the packet data unit specified in the specification part 318, the replacement part 320 replaces its signal data before the hard decision with its signal data after the hard decision.

Next, a description is given of an operation. The demodulated signals after the soft decision are input to the turbo decoder as the first through third input signal sequences. The first and second input signal sequences ya and yb are input to the first decoding part 302 to be decoded. The first and third input signal sequences ya and yc are input to the second decoding part 308 to be decoded. The first and second decoding parts 302 and 308 repetitively output the decoded signals L1 and L2 while exchanging the extrinsic likelihood information Le1, Le1', Le2, and Le2' with each other. By repetitively feeding back the extrinsic likelihood information to each other, error correction capability in decoding can be improved compared with a case without performing it. The decoding result thus calculated is subjected to a hard decision in the hard decision part 314 and to error checking in the error check part 316. If no error is detected with respect to any packet data unit, this shows that the block is received and decoded satisfactorily, so that the processing of a later stage not graphically illustrated is caused to proceed. If an error is detected with respect to all of the packet data units, restoration of appropriate data is sought by, for instance, increasing the number of repetitions of decoding or requesting retransmission from the transmission end.

If the error checking result is satisfactory with respect to some packet data units and is not satisfactory with respect to other packet data units, the following operation is performed according to this embodiment. The check result of the error check part 316 is also reported to the specification part 318. The specification part 318 determines a packet data unit of the block with respect to which no error has been detected in the error checking performed on each packet data unit. For instance, it is assumed that N packet data units $PDU_1$ through $PDU_N$ are included in a single block and that their respective error checking results $PDU\text{-}CRC_1$ through $PDU\text{-}CRC_N$ are obtained. It is assumed that of these N error checking results, the $r^{th}$ one, $PDU\text{-}CRC_r$, is satisfactory (without an error) and the others are not satisfactory (with errors). In this case, the specification part 318 specifies and retains the hard decision result U(k) corresponding to the $r^{th}$ packet data unit $PDU_r$ in the decoding result subjected to the hard decision U(k), and prepares for subsequent processing.

With respect to a packet data unit in the input signal sequence corresponding to the packet data unit specified in the specification part 318, the replacement part 320 replaces its signal data before the hard decision with its signal data after the hard decision. In the above-described case, for instance, soft decision signal data $y_a(k)$ pertaining to the $PDU_r$ in the first input signal sequence ya are replaced with the $\acute{U}(k)$ after the hard decision (no replacement is performed with respect to signal data pertaining to the other packet data units $PDU_s$ [s=1, ..., N, s≠r] in the input signal sequence ya). Further, it is also possible to further perform replacement of signal data on the second and third input signal sequences yb and yc on a selective basis (it is necessary, however, to perform the replacement in consideration of the effect of convolutional encoding with respect to the second input signal sequence and in consideration of the effect of interleaving and convolutional encoding with respect to the third input signal sequence). The input signal sequence in which part of the packet data units is replaced (a new input signal sequence) is input again to the first decoding part 302, so that calculations for decoding are made. In these decoding calculations, with respect to the $PDU_r$ of the packet data units included in the block, the binary data $U(k)$, whose correctness is assured by the hard decision made thereon, is employed instead of the soft decision data $y_a(k)$. Thereafter, the decoded signal is output repetitively.

According to this embodiment, of packet data units subjected to a hard decision, a packet data unit whose error checking result is satisfactory is specified and retained, so that part of an input signal sequence is replaced with signal data after the hard decision, and decoding calculations are reperformed. The correctness of the part of the input signal sequence (the part subjected to the replacement) is assured. Accordingly, it is possible to improve the accuracy and convergence of subsequent decoding calculations. In this respect, there is a great difference from the conventional method in which the error checking result is used only to determine the correctness of the entire block.

Second Embodiment

Figure 4:
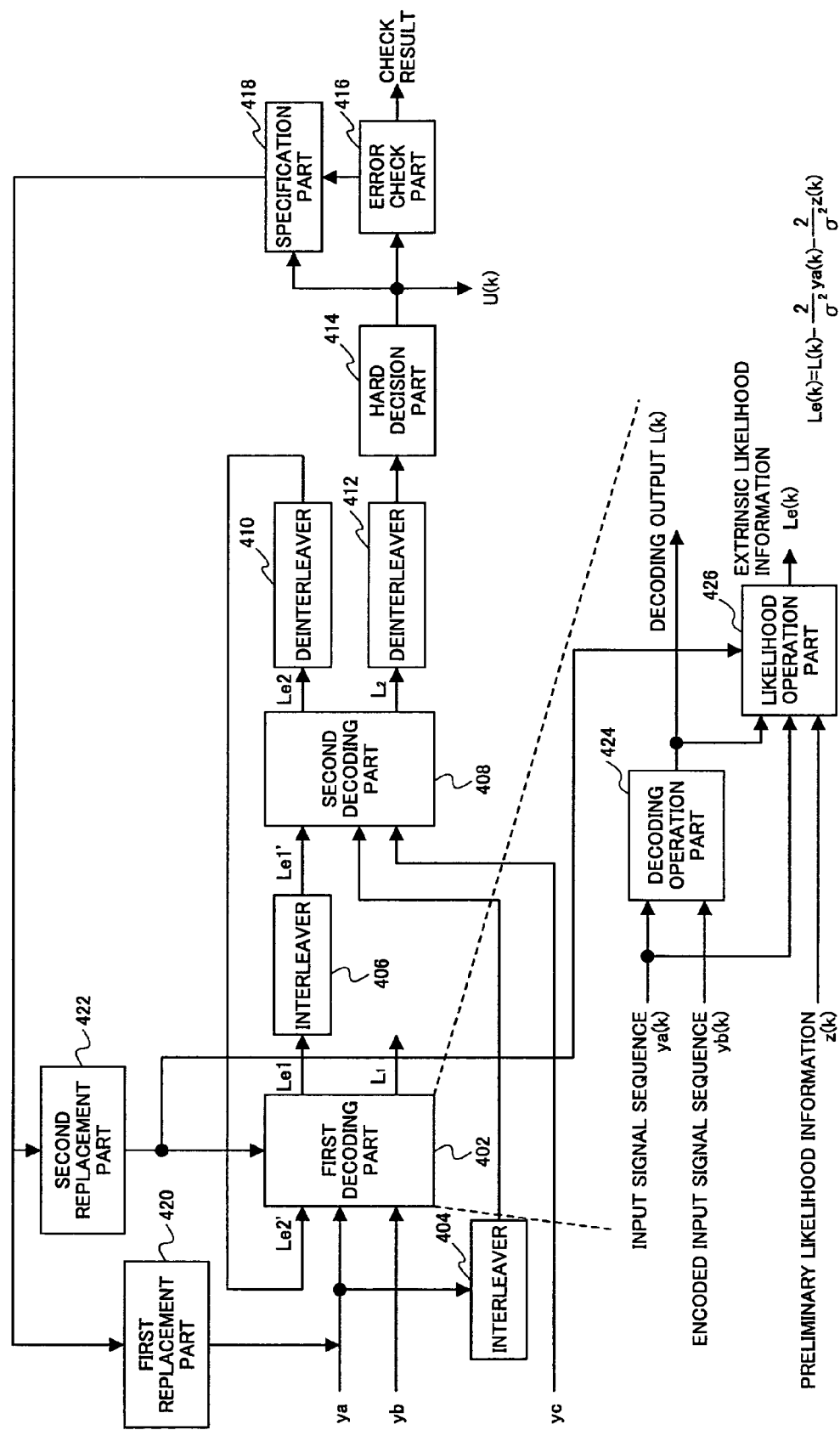
FIG. 4 is a block diagram for illustrating a turbo decoding method according to a second embodiment of the present invention.

FIG. 4 is a block diagram for illustrating a turbo decoding method according to a second embodiment of the present invention. As in the above-described embodiment, the signal sequence to be transmitted is transmitted in the first signal sequence xa in the exact form of the input signal sequence, the second signal sequence xb as a result of subjecting the input signal sequence to convolutional encoding, and the third signal sequence xc as a result of subjecting the input signal to interleaving and convolutional encoding. These signal sequences of three lines are transmitted to a reception end after being subjected to modulation. The received signals are demodulated, so that the three signal sequences ya, yb, and yc corresponding to the signal sequences of three lines xa, xb, and xc created at the transmission end are obtained. These signals are signals subjected to a soft decision, but are finally subjected to a hard decision.

A turbo decoder according to this embodiment includes a first decoding part 402, to which the first and second input signal sequences ya and yb and preliminary likelihood information Le2' are input. Based on these input signals, the first decoding part 402 outputs a first output signal L1 and extrinsic likelihood information Le1, which are decoding results.

The first input signal sequence ya is interleaved by an interleaver 404 to be input to a second decoding part 408.

The first extrinsic likelihood information Le1 from the first decoding part 402 is also interleaved by an interleaver 406 to be input to the second decoding part 408. The third input signal sequence yc is also input to the second decoding part 408, and Le1', which is the interleaved first extrinsic likelihood information Le1 from the first decoding part 402, is input to the second decoding part 408 as preliminary likelihood information. The second decoding part 408 outputs a second output signal L2 and extrinsic likelihood information Le2, which are decoding results.

The extrinsic likelihood information Le2 is input to the first decoding part 402 as preliminary likelihood information after being deinterleaved by a deinterleaver 410. The second output signal L2 from the second decoding part 408 is deinterleaved by a deinterleaver 412 to be input to a hard decision part 414. The hard decision part 414 makes a hard decision on soft decision data included in the decoded signal, and creates a binary-signal data sequence $U(k)$ (k represents a sample number). The data sequence $U(k)$ after the hard decision is input to an error check part 416. The error check part 416 performs a cyclic redundancy check (CRC) on all packet data units (PDUs) included in the data sequence $U(k)$ of one block after the hard decision.

The turbo decoder according to this embodiment includes a specification part 418. The specification part 418 determines a packet data unit of the block with respect to which no error has been detected in the error checking performed on each packet data unit. The turbo decoder according to this embodiment includes a first replacement part 420 connected to the specification part 418. With respect to a packet data unit in the input signal sequence corresponding to the packet data unit specified in the specification part 418, the first replacement part 420 replaces its signal data before the hard decision with its signal data after the hard decision.

Further, the turbo decoder according to this embodiment includes a second replacement part 422. The second replacement part 422 provides the first decoding part 402 with the signal data $U(k)$ after the hard decision with respect to the packet data unit specified in the specification part 418. The first decoding part 402 includes a decoding operation part 424 that outputs a decoded signal $L(k)$ decoded based on the preliminary likelihood information and the input signals. Further, the first decoding part 402 includes a likelihood operation part 426 that calculates extrinsic likelihood information $Le(k)$ based on the preliminary likelihood information, the decoding output $L(k)$, and a signal from the input signal sequence.

Next, a description is given of an operation. The demodulated signals after the soft decision are input to the turbo decoder as the first through third input signal sequences. The first and second decoding parts 402 and 408 repetitively output the decoded signals L1 and L2 while exchanging the extrinsic likelihood information Le1, Le1', Le2, and Le2' with each other. The decoding result thus calculated is subjected to a hard decision in the hard decision part 414 and to error checking in the error check part 416. If no error is detected with respect to any packet data unit, this shows that the block is received and decoded satisfactorily, so that the processing of a later stage not graphically illustrated is caused to proceed. If an error is detected with respect to all of the packet data units, restoration of appropriate data is sought by, for instance, increasing the number of repetitions of decoding or requesting retransmission from the transmission end.

If the error checking result is satisfactory with respect to some packet data units and is not satisfactory with respect to other packet data units, the following operation is performed according to this embodiment. The check result of the error check part 416 is also reported to the specification part 418. The specification part 418 determines a packet data unit of the block with respect to which no error has been detected in the error checking performed on each packet data unit. For instance, it is assumed that N packet data units $PDU_1$ through $PDU_N$ are included in a single block and that their respective error checking results $PDU\text{-}CRC_1$ through $PDU\text{-}CRC_N$ are obtained. It is assumed that of these N error checking results, the $r^{th}$ one, $PDU\text{-}CRC_r$, is satisfactory (without an error) and the others are not satisfactory (with errors). In this case, the specification part 418 specifies and retains the hard decision result U(k) corresponding to the $r^{th}$ packet data unit $PDU_r$ in the decoding result subjected to the hard decision U(k), and prepares for subsequent processing.

With respect to a packet data unit in the input signal sequence corresponding to the packet data unit specified in the specification part 418, the first replacement part 420 replaces its signal data before the hard decision with its signal data after the hard decision. In the above-described case, for instance, soft decision signal data $y_a(k)$ pertaining to the $PDU_r$ in the first input signal sequence ya are replaced with the U(k) after the hard decision. Further, it is also possible to further perform replacement of signal data on the second and third input signal sequences yb and yc on a selective basis (it is necessary, however, to perform the replacement in consideration of the effect of convolutional encoding with respect to the second input signal sequence and in consideration of the effect of interleaving and convolutional encoding with respect to the third input signal sequence). The input signal sequence in which part of the packet data units is replaced (a new input signal sequence) is input again to the first decoding part 402, so that calculations for decoding are made. In these decoding calculations, with respect to the $PDU_r$ of the packet data units included in the block, the binary data U(k), whose correctness is assured by the hard decision made thereon, is employed instead of the soft decision data $y_a(k)$. Thereafter, the decoded signal is output repetitively.

Further, the second replacement part 422 also provides the first decoding part 402 with the signal data U(k) after the hard decision with respect to the packet data unit specified in the specification part 418. The decoding operation part 424 of the first decoding part 402 calculates a decoding output L(k) decoded based on signals from the input signal sequences. Further, the likelihood operation part 426 calculates extrinsic likelihood information Le(k) by the following equation based on the preliminary likelihood information, the decoding output L(k), and a signal from the input signal sequence:

$$Le(k)=L(k)-(2/\sigma^2)y_a(k)-(2/\sigma^2)z(k),$$

where σ represents a standard deviation for the probability density function of received data, and z(k) represents preliminary likelihood information (Le1', Le2') for the $k^{th}$ sample.

When the input signal is partially changed in the first replacement part, that is, when some error checking results in the block are satisfactory but the others are not satisfactory, the likelihood operation part 426 calculates extrinsic likelihood information using a signal from the second replacement part 422. More specifically, the likelihood operation part 426 calculates the extrinsic likelihood information Le(k), replacing an absolute value |z(k)| of preliminary likelihood information with a maximum value and using the signal data U(k) after the hard decision instead of the soft decision data $y_a(k)$ with respect to the signal data of the packet data unit $PDU_r$ determined to be correct in the specification part 418. The absolute value |z(k)| of preliminary likelihood information is maximized because the signal data are certain.

According to this embodiment, not only the input signal sequence but also the extrinsic likelihood information is corrected based on the error checking result. Accordingly, not only can decoding be performed efficiently as in the first embodiment, but also the accuracy and convergence of decoding calculations can be further improved.

According to this embodiment, the second replacement part 422 is configured to affect signal processing in the first decoding part 402. The second replacement part 422 may also be configured to affect signal processing in the second decoding part 408. This is because the first and second decoding parts have the same functional means or configuration and it is satisfactory if decoding is performed using the hard decision result of a packet data unit proved to be correct by error checking and it is reflected in extrinsic likelihood information.

Figure 5:
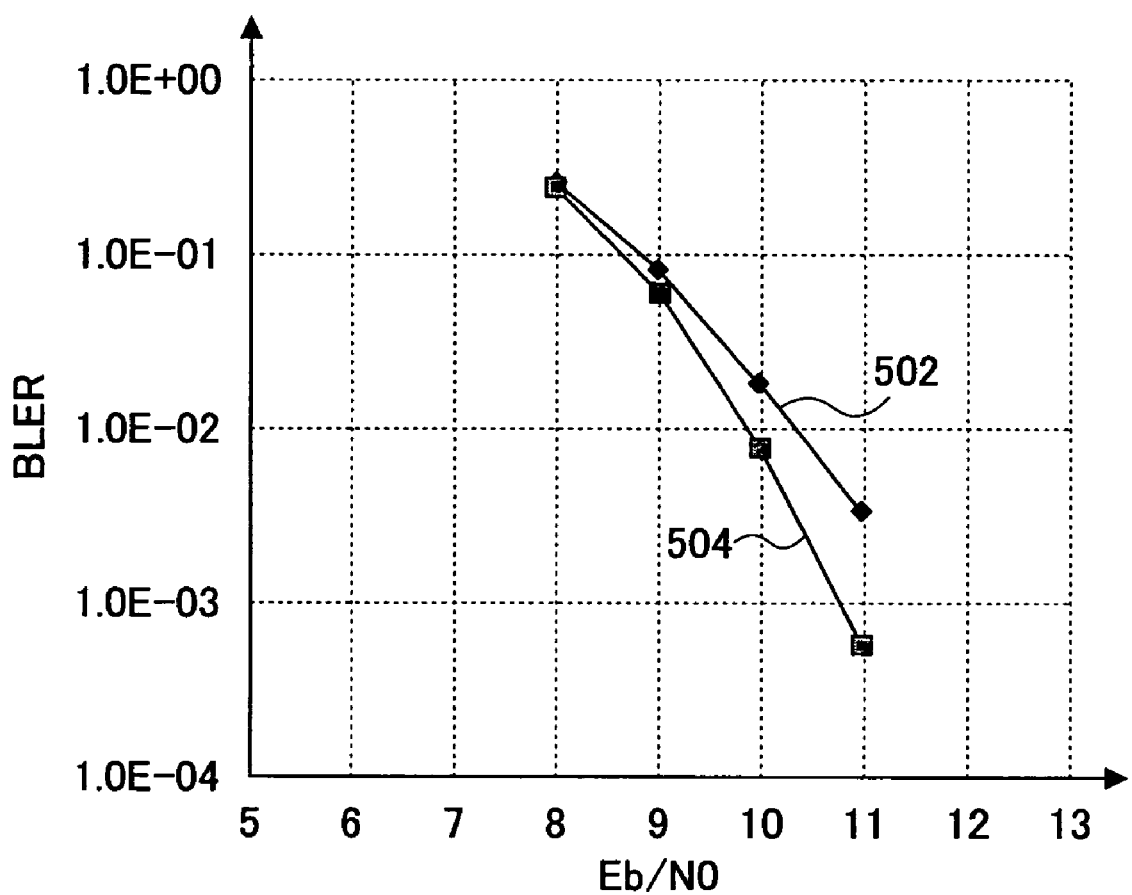
FIG. 5 shows simulation results with respect to the embodiments of the present invention.

FIG. 5 shows the results of a simulation performed using the turbo decoder according to the first embodiment of the present invention. In this simulation, a communications system using orthogonal frequency division multiplexing (OFDM) and code division multiple access (CDMA) is assumed with the modulation method being 64 QAM and the number of packet data units in a single block being 26. The horizontal axis represents the ratio of signal energy to noise power density (signal-to-noise ratio) per bit $E_b/N_0$. The vertical axis represents block error rate (BLER). The block error rates for four types of signal-to-noise ratios $E_b/N_0$ were checked, and determined to be values represented by graph 502 according to the conventional method and values represented by graph 504 according to the embodiments of the present invention.

Around where noise levels are relatively high ($E_b/N_0$=approximately 8-9), block error rates are high, and the block error rates represented by the graphs 502 and 504 are high values hardly different from each other. It is shown, however, that the embodiments of the present invention provide better characteristics with low block error rates around such signal-to-noise ratios as are employable in actual communications systems ($E_b/N_0$=approximately 10-11).

Thus, the turbo decoders according to the embodiments of the present invention include a decoding part that decodes a signal based on input signal sequences and preliminary likelihood information, and outputs extrinsic likelihood information; a specification part that specifies a packet data unit whose error checking result has been satisfactory; and a replacement part that replaces the signal data of the packet data unit with the signal data after a hard decision. As a result, the next decoding calculation is performed based on a signal sequence whose signal data correctness is assured. This makes it possible to improve the accuracy and convergence of decoding calculations, and accordingly, to perform decoding with efficiency.

According to the embodiments of the present invention, error checking is performed by a cyclic redundancy check (CRC). CRC can be inserted into a data signal sequence with ease, and its checking is not complicated. Some communications systems have employed CRC as a standard. Accordingly, in such communications systems, it is possible to realize the embodiments of the present invention without newly introducing a function or means for conducting a CRC check. According to the embodiments of the present invention, decoding efficiency can be improved by effectively using the CRC check result of each of packet data units included in a block not only for determining the correctness of the entire block, but also for the next decoding calculation.

According to the second embodiment of the present invention, extrinsic likelihood information, calculated based on a hard decision result U(k) with respect to a PDU specified in the specification part and a decoding output L(k) and preliminary likelihood information z(k) with respect to the PDU, is used as preliminary likelihood information in the next decoding calculation. As a result, not only the input signal sequence but also the preliminary likelihood information is corrected. Accordingly, it is possible to further improve the accuracy and convergence of decoding calculations.

The present invention is not limited to the specifically disclosed embodiments, and variations and modifications may be made without departing from the scope of the present invention.

What is claimed is:

1. A turbo decoder receiving a demodulated input signal before a hard decision, the input signal including blocks each being formed of a plurality of data units, the turbo decoder outputting a decoded signal block by block, the turbo decoder comprising:
   a decoding part configured to output a decoded output signal and extrinsic likelihood information relating to signal likelihood based on the input signal and preliminary likelihood information relating to signal likelihood, wherein the output signal is repetitively generated and the extrinsic likelihood information is used as the preliminary likelihood information in creating the next output signal;
   a specification part configured to specify one of the data units of the block with respect to which no error is detected in error checking performed on each of the data units included in the output signal subjected to the hard decision; and
   a replacement part configured to input a signal sequence to the decoding part as the input signal, the replacement part creating the signal sequence by replacing signal data before the hard decision with signal data after the hard decision with respect to the data unit specified by the specification part.

2. The turbo decoder as claimed in claim 1, wherein the error checking is performed by a cyclic redundancy check.

3. The turbo decoder as claimed in claim 1, wherein the extrinsic likelihood information recalculated based on a decoding result with respect to the data unit specified by the specification part, a signal from the signal sequence, and the preliminary likelihood information, is input to the decoding part as the preliminary likelihood information.

4. The turbo decoder as claimed in claim 1, further comprising:
   a hard decision part configured to make the hard decision on the output signal from the decoding part.

5. The turbo decoder as claimed in claim 1, further comprising:
   an error detection part configured to perform the error checking on each of the data units included in the output signal subjected to the hard decision.

6. A turbo decoder receiving a demodulated input signal before a hard decision, the input signal including blocks each being formed of a plurality of data units, the turbo decoder outputting a decoded signal block by block, the turbo decoder comprising:
   a first decoding part configured to output a decoded first output signal and first extrinsic likelihood information relating to signal likelihood based on the input signal and preliminary likelihood information relating to signal likelihood;
   a second decoding part configured to output a decoded second output signal and second extrinsic likelihood information relating to signal likelihood based on the input signal and the first extrinsic likelihood information from the first decoding part, wherein the second extrinsic likelihood information is used as the preliminary likelihood information;
   a specification part configured to specify one of the data units of the block with respect to which no error is detected in error checking performed on each of the data units included in the second output signal subjected to the hard decision; and
   a replacement part configured to input a signal sequence to the first decoding part as the input signal, the replacement part creating the signal sequence by replacing signal data before the hard decision with signal data after the hard decision with respect to the data unit specified by the specification part.

7. The turbo decoder as claimed in claim 6, wherein the error checking is performed by a cyclic redundancy check.

8. The turbo decoder as claimed in claim 6, wherein the first extrinsic likelihood information recalculated based on a decoding result with respect to the data unit specified by the specification part, a signal from the signal sequence, and the preliminary likelihood information, is input to the second decoding part as preliminary likelihood information.

9. The turbo decoder as claimed in claim 6, further comprising:
   a hard decision part configured to make the hard decision on the second output signal from the second decoding part.

10. The turbo decoder as claimed in claim 6, further comprising:
    an error detection part configured to perform the error checking on each of the data units included in the second output signal subjected to the hard decision.

11. A turbo decoder receiving a demodulated input signal before a hard decision, the input signal including blocks each being formed of a plurality of data units, the turbo decoder outputting a decoded signal block by block, the turbo decoder comprising:
    a first decoding part configured to output a decoded first output signal and first extrinsic likelihood information relating to signal likelihood based on the input signal and first preliminary likelihood information relating to signal likelihood;
    a second decoding part configured to output a decoded second output signal and second extrinsic likelihood information relating to signal likelihood based on the input signal and second preliminary likelihood information relating to signal likelihood, wherein the first extrinsic likelihood information from the first decoding part is used as the second preliminary likelihood information, and the second extrinsic likelihood information is used as the first preliminary likelihood information;
    a specification part configured to specify one of the data units of the block with respect to which no error is detected in error checking performed on each of the data units included in the second output signal subjected to the hard decision;
    a first replacement part configured to input a signal sequence to the first decoding part as the input signal, the first replacement part creating the signal sequence by replacing signal data before the hard decision with signal data after the hard decision with respect to the data unit specified by the specification part; and a second replacement part configured to replace the signal data before the hard decision with the signal data after the hard decision and changing the first or second preliminary likelihood information to a predetermined value with respect to the data unit specified by the specification part so that the first or second decoding part newly calculates the first or second extrinsic likelihood information.

12. The turbo decoder as claimed in claim 11, wherein the error checking is performed by a cyclic redundancy check.

13. The turbo decoder as claimed in claim 11, wherein the first extrinsic likelihood information recalculated based on a decoding result with respect to the data unit specified by the specification part, a signal from the signal sequence, and the first preliminary likelihood information changed to the predetermined value, is input to the second decoding part as the second preliminary likelihood information.

14. The turbo decoder as claimed in claim 11, further comprising:

a hard decision part configured to make the hard decision on the second output signal from the second decoding part.

15. The turbo decoder as claimed in claim 11, further comprising:

an error detection part configured to perform the error checking on each of the data units included in the second output signal subjected to the hard decision.

16. The turbo decoder as claimed in claim 11, wherein the second extrinsic likelihood information recalculated based on a decoding result with respect to the data unit specified by the specification part, a signal from the signal sequence, and the second preliminary likelihood information changed to the predetermined value, is input to the first decoding part as the first preliminary likelihood information.

* * * * *